United States Patent
Coventry-Saylor

(10) Patent No.: US 6,730,770 B2
(45) Date of Patent: May 4, 2004

(54) METHOD OF PREPARING A HIGHER SOLIDS PHENOLIC RESIN

(75) Inventor: Kathleen H. Coventry-Saylor, Exton, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 10/160,324

(22) Filed: May 31, 2002

(65) Prior Publication Data

US 2003/0224119 A1 Dec. 4, 2003

(51) Int. Cl.⁷ ............................. C08F 14/04; C08F 14/12
(52) U.S. Cl. ....................... 528/129; 528/137; 528/486; 528/488; 528/503; 524/841; 524/594
(58) Field of Search ................................. 528/129, 137, 528/486, 488, 503; 524/841, 594

(56) References Cited

U.S. PATENT DOCUMENTS

| | | |
|---|---|---|
| 2,676,898 A | 4/1954 | Folger et al. |
| 2,905,393 A | 12/1959 | Federighi et al. |
| 2,937,159 A | 5/1960 | McKay et al. |
| 3,322,702 A | 5/1967 | Smucker et al. |
| 3,380,877 A | 4/1968 | Smucker et al. |
| 3,432,453 A | 3/1969 | Gladney et al. |
| 3,624,247 A | 11/1971 | Gladney et al. |
| 3,684,467 A | 8/1972 | Smucker et al. |
| 3,704,199 A | 11/1972 | Smucker et al. |
| 3,932,334 A | 1/1976 | Deuzeman et al. |
| 3,935,139 A | 1/1976 | Ashall |
| 3,956,204 A | 5/1976 | Higginbottom |
| 3,956,205 A | 5/1976 | Higginbottom |
| 4,028,367 A | 6/1977 | Higginbottom |
| RE30,375 E | 8/1980 | Deuzeman et al. |
| 4,408,003 A | 10/1983 | Robinson et al. |
| 4,433,120 A | 2/1984 | Chiu |
| 4,650,825 A | 3/1987 | Jellinek et al. |
| 4,663,418 A | 5/1987 | Jellinek et al. |
| 4,663,419 A | 5/1987 | Fugier et al. |
| 4,680,058 A | 7/1987 | Shimizu et al. |
| 4,694,028 A | 9/1987 | Saeki et al. |
| 4,757,108 A | 7/1988 | Walisser |
| 4,873,270 A | 10/1989 | Aime et al. |
| 4,904,516 A | 2/1990 | Creamer |
| 5,243,015 A | 9/1993 | Hutchings et al. |
| 5,300,562 A | 4/1994 | Coventry et al. |
| 5,317,050 A | 5/1994 | Gerber |
| 5,358,748 A | 10/1994 | Matthews et al. |
| 5,362,842 A | 11/1994 | Graves et al. |
| 5,378,793 A | 1/1995 | Orpin |
| 5,473,012 A | 12/1995 | Coventry et al. |
| 5,505,998 A | 4/1996 | Matthews et al. |
| 5,538,761 A | 7/1996 | Taylor |
| 5,670,585 A | 9/1997 | Taylor et al. |
| 5,795,934 A | 8/1998 | Parks et al. |
| 5,804,254 A | 9/1998 | Nedwick et al. |
| 5,864,003 A | 1/1999 | Qureshi et al. |
| 6,133,403 A | 10/2000 | Gerber |

FOREIGN PATENT DOCUMENTS

| | | |
|---|---|---|
| EP | 0190468 | 8/1986 |
| FR | 2139756 | 1/1971 |
| JP | 57159809 | 10/1982 |
| WO | WO 98/03568 | 7/1997 |

OTHER PUBLICATIONS

Rohm and Haas Company, Textiles and Nonwovens, RHOPLEX ®GL–618, Elastomeric Acrylic Binder for Industrial Nonwovens.

Robert W. Martin, Shell Development Co., Emeryville, California, "The Chemistry of Phenolic Resins," The Formation, Structure, and Reactions of Phenolic Resins and Related Products, pp. 88–97.

Primary Examiner—Duc Truong
(74) Attorney, Agent, or Firm—Paul & Paul

(57) ABSTRACT

A phenol-formaldehyde resole resin for use as a binder for glass fibers is acidified with sulfamic acid to a pH of 3 or less after base-catalyzed resinification. An increase in actual solids observed compared with neutralized resin, reflecting a desired improvement in efficiency.

20 Claims, No Drawings

METHOD OF PREPARING A HIGHER SOLIDS PHENOLIC RESIN

BACKGROUND OF THE INVENTION

1. Field of the Invention

The present invention relates to the manufacture of fiberglass insulation materials, and more particularly to the preparation of phenolic resin for glass fibers.

2. Brief Description of the Prior Art

Aqueous dispersions of phenol-formaldehyde resole resins are frequently used in the manufacture of glass fiber insulation materials, such as insulative batts for walls, in roofs and ceilings, insulative coverings for pipes, and the like. Typically, after glass fiber has been formed, the still hot fiber is sprayed with aqueous binder dispersion in a forming chamber or hood, with the fibers being collected on a conveyer belt in the form of a wool-like mass associated with the binder. In some cases, a glass fiber web is sprayed with the aqueous dispersion. Both resole and urea-modified resole resins have been employed for this purpose, the urea contributing to the "punking" resistance of the binder (i.e., resistance to exothermic decomposition at elevated temperatures), and reducing volatiles liberated when the resin is cured at elevated temperature.

An excess of formaldehyde over phenol is typically used so as to minimize the free phenol in the reaction product. Subsequently, other components (for example, urea) may be included to scavenge free formaldehyde.

Frequently, in the manufacture of glass fiber insulation materials, the aqueous resole resin is prepared in advance of the preparation of the binder, or is supplied by a resin manufacturer and stored until shortly before use. The resole is typically prepared by reaction of phenol and formaldehyde under basic conditions, the resulting reaction mixture being neutralized to a slightly basic pH by addition of a strong acid, to provide a water-dilutable resole. Subsequently, the binder is prepared by adding to the resole resin an acid catalyst for curing the resin, water to dilute the dispersion, and optionally other components, such as a silane glass-adhesion promoter, an oil emulsion lubricant, and urea to reduce volatile materials liberated during curing.

It is desirable to obtain the highest possible level of solids during preparation of the resole resin. High solids correlate with reduced volatile liberation and enhanced efficiency.

The resole resin can be prepared by any of a variety of specific processes, such as disclosed in U.S. Pat. No. 5,300,562, hereby incorporated by reference. Often, a single stage process is employed. Phenol and formaldehyde are mixed with a strongly basic catalyst, such as an alkali metal base, and the mixture is maintained at an elevated temperature until the desired degree of reaction has occurred, after which time the reaction mixture is cooled and neutralized by addition of a suitable acid. Alternatively, a multiple step process can be employed such one involving an initial reaction step under acid conditions and a subsequent reaction step under basic conditions, followed by neutralization.

U.S. Pat. No. 5,362,842 discloses a two-step process for making a urea-formaldehyde resin composition including an initial step under basic conditions and a second step under acidic conditions, during which the pH is maintained in the range from 4.9 to 5.2.

U.S. Pat. Nos. 5,358,748 and 5,505,998 disclose an acidic glass fiber binding composition. A strong aqueous soluble acid is employed in preparing the binder composition in order to reduce the level of alkylamine otherwise produced during cure. Alklyamines are disclosed to be undesirable odiferous materials produced by degradation of urea (the formaldehyde scavenger) during cure. A strong acid, that is, an acid with a $pK_a$ value of 4 or less, is added to the binder composition to lower the pH to a value between 4.5 and 6.5, preferably between 4.5 and 6. Suitable acids include sulfamic acid, oxalic acid and sulfuric acid. The binder includes a phenol formaldehyde resin, preferably having a low free formaldehyde content and a low free phenol content. According to this patent, most commercially available phenol formaldehyde resins have an alkaline pH range, such as between 9 and 9.6, and this makes the addition of the strong acid to provide a pH between 4.5 and 6.5 a quite different thing.

According to U.S. Pat. No. 5,538,761, phenol-formaldehyde condensates prepared under acid conditions or with low levels of formaldehyde under basic conditions are generally not water soluble, as significant quantities of insoluble dihydroxydiphenylmethanes are produced.

U.S. Pat. No. 5,538,761 discloses a process for preparing binder-treated fiberglass exhibiting lower formaldehyde and ammonia emissions by use of an acidifying hydrolyzable salt, a mineral acid, or partial ester of carboxylic acid to lower the instantaneous pH of the urea-extended pre-react binder solution to less than 5.5, and preferably in the range 3.0 to 5.0, and more preferably in the range 4.0 to 5.0. The process also includes coating fiberglass with the acidified solution, and curing the binder. The "pre-react" is a binder solution comprising phenolformaldehyde resole resin to which urea has been added and permitted to react with the free formaldehyde.

U.S. Pat. No. 5,864,003 discloses a thermosetting resin composition containing a mixture of a phenol-formaldehyde resole resin and a latent curing agent. The latent curing agent acts synergistically with a strong acid catalyst of the type conventionally used to cure phenol resole resins. Such strong acid catalysts include inorganic acids such as sulfuric acid, hydrochloric acid, and phosphoric acid and organic acids such as sulfamic acid, tricholoracetic acid, and aromatic di- and polysulfonic acids, such as phenyl sulfonic and other organosulfonic acids. The U.S. Pat. No. 5,864,003 patent notes that the resole resin can be neutralized after alkaline reaction of the phenol and formaldehyde using a conventional acid neutralizing agent such as methane sulfonic acid, hydrochloric acid, phosphoric acid, or sulfuric acid. Neutralization is accomplished by adding a sufficient amount of acid to establish a pH of between 6.5 and 7.5 in the aqueous resin, although a pH as low as 4.0 may result in stable resin systems.

Given the large volume of resinous binder compositions required in the production of fiberglass insulation and for other uses, and the need to minimize offensive emissions of formaldehyde and other compounds during manufacture, there is a continuing need for phenol-formaldehyde resin compositions for use in binders which exhibit low emissions during cure, and that have high solids.

SUMMARY OF THE INVENTION

The present invention provides an improved method or process for preparing a phenolic resin for use as a binder for glass fibers and giving higher solids than prior art processes. Higher solid compositions are very desirable from an emission-reduction perspective. This process provides more efficient resin compositions by increasing the solids level of the resin composition, and reduced emissions during cure, while maintaining good storage stability, as determined by the water dilutability of the resin composition. The process can be used to prepare compositions including either water-soluble phenol-formaldehyde resole resins or water-soluble phenol-formaldehyde resole resins modified with a nitrogenous reactant such as urea and/or ammonia. The present process provides compositions that exhibit very good stability, even at low pH.

The process comprises preparing a water-soluble phenol-formaldehyde resole resin by first preparing an initial aqueous mixture including formaldehyde and phenol, and adding a basic polymerization catalyst to the initial aqueous mixture. The aqueous mixture is then maintained at a predetermined temperature during reaction of the phenol and formaldehyde to form the water-soluble phenol-formaldehyde resole resin until the free formaldehyde content of the aqueous mixture drops to a predefined level. Next, the aqueous mixture is cooled, and finally acidified with sulfamic acid to a pH of no greater than 3. Preferably, the aqueous mixture including the unmodified resole resin is acidified to a pH from about 2 to 3.

The acidified resole resin of the present process is stable at low pH. The acidified resole resin can be modified by subsequent addition of one or more acidic modifiers to alter or improve the properties of the resulting resin and/or the binder subsequently prepared from the resole resin. Examples of suitable acidic modifiers that can be employed include latent catalysts such as ammonium sulfate, reactive diluents such as benzylic alcohols, weak acids such as boric acid, and fatty acids such as oleic and stearic acids, and esters, such as diethyl phosphite.

Optionally, the process can be used to prepare a modified phenol-formaldehyde resin composition by preparing an aqueous reaction mixture including the phenol-formaldehyde resole resin and a nitrogenous reactant, such as urea, ammonia, or a mixture of urea and ammonia; and permitting the nitrogenous reactant to react with the phenol-formaldehyde resole resin to form a modified resin.

Subsequently, preparation of the binder is completed by adding a catalyst for curing the resole resin.

Preferably, the phenol-formaldehyde resin has a formaldehyde-to-phenol mole ratio of from about 2.5:1 to 4.2:1, and more preferably, from about 3.2:1 to 4.0:1. It is also preferred that the predefined level be about 40 percent by weight of the free formaldehyde in the initial aqueous mixture.

Further, the process of the present invention also optionally provides for adding ammonia and/or urea to the reaction mixture as a formaldehyde scavenger. Preferably, the ammonia is added in sufficient quantity to give a weight ratio of formaldehyde scavenger to solids of unmodified resin of from about 1.0:100 to 3.0:100.

When a urea or ammonia-modified binder is desired, it is preferred that the mole ratio of the urea or ammonia modifying agent to the free formaldehyde of the phenol-formaldehyde resin be from about 1:1 to 1.75:1, and that the aqueous mixture be maintained at a temperature of from about 5° C. to 30° C. while permitting the modifying agent to react with the resole resin.

The present invention also provides a process for producing a glass fiber batt, which comprises preparing a binder as described above and spraying the binder on glass fibers to form a batt; and then curing the binder at an elevated temperature.

In completing preparation of the aqueous mineral fiber binder composition, other typical binder components, such as an acid elevated temperature cure catalyst, a mineral oil lubricant, and an organo-silane adhesion promoter, can be added to the aqueous mixture of the modified resole. Such components can be added to the aqueous mixture of modified resole resin shortly before application of the binder to the glass fibers.

DETAILED DESCRIPTION OF THE PREFERRED EMBODIMENTS

The phenol-formaldehyde resole resin employed in the process of the present invention can be prepared by conventional methods known in the art, such as those which give water-soluble resole resin and employ commercial grade phenol and formaldehyde materials. For example, the formaldehyde can be provided in the form of an aqueous formalin solution have 30–50 percent by weight formaldehyde, although other forms of formaldehyde known to the art can also be used. In addition to phenol itself, other hydroxy-functional aromatic compounds can be employed, or used in addition to phenol. Examples of substituted phenols that can be used include alkyl-substituted phenols, such as o-cresol, m-cresol, and p-cresol, 3,5-xylenol, 3,4-xylenol, 3,4,5-trimethyl phenol, 3-ethyl phenol, 3,5-diethyl phenol, p-butyl phenol, 3,5 dibutyl phenol, p-amyl phenol, and p-octyl phenol; cycloalkyl-substituted phenols such as cyclohexyl phenol and 3,5-dicyclohexyl phenol; alkenyl-substituted phenols; aryl-substituted phenols such as p-phenyl phenol; alkoxy-substituted phenols such as 3,5-dimethyoxyphenol, p-ethoxy phenol, p-butoxy phenol, and 3,4,5-trimethoxyphenol; aryloxy phenols such as p-phenoxy phenol; and halogen-substituted phenols such as p-chlorophenol as well as polycyclic phenols such as napthol, anthranol, and substituted derivatives. Similarly, dihydric phenols such as catechol, resorcinol, hydroquinone, bisphenol A and bisphenol ° F. can be used. However, phenol itself is especially preferred. Mixtures of phenols can also be used, preferably, mixtures which include phenol itself.

Similarly, other reactive aldehydes can be substituted in whole or in part for formaldehyde to produce the aqueous solution of water-soluble resole resin. Examples of other reactive aldehydes that can be used include acetaldehyde, propionaldehyde and benzaldehyde. Formaldehyde is especially preferred.

The preparation of resole resins is reviewed and described in R. W. Martin, *The Chemistry of Phenolic Resins* (John Wiley & Sons, Inc., New York 1956) at 88–97.

The process of this invention relates to the preparation of a water-soluble phenol-formaldehyde resole resin. A base-catalyzed condensation of the phenol and the aldehyde is typically used to prepare the resin. The reaction, which is exothermic, is initiated after mixing the phenol and the aldehyde by addition of the catalyst. The proportion of phenol to the aldehyde is selected to yield a resole-type resin (stoichiometric excess of formaldehyde) when formaldehyde and phenol are used, the mole ratio of formaldehyde to phenol preferably being from about 2.5:1 to 4.2:1, and more preferably from about 3.2:1 to 4.0:1. Preferably, an aqueous mixture of formaldehyde and phenol is maintained at a first temperature of from about 40° C. to 50° C. as a basic polymerization catalyst is added.

The catalyst used in the process of preparing the resole resin can include at least one basic alkali metal or alkaline earth metal base. Examples of alkali metal bases that can be used include the hydroxides of sodium, potassium, and lithium. Examples of alkaline earth metal bases that can be used include the oxides and hydroxides of calcium, barium and strontium, such as calcium oxide and calcium hydroxide. Potassium hydroxide or sodium hydroxide is preferred over calcium hydroxide, as the alkali metal bases appear to provide greater stability than calcium hydroxide in the present process. Other strongly basic water-soluble substances that do not react with formaldehyde, such as tertiary amines such as triethylamine, tertiary amino alcohols such as 2-dimethylamino-2-methyl-1-propanol and 2-(dimethylamino)-2-(hydroxmethyl)-1,3-propanediol, and the like, can also be used in catalyzing the preparation of the resole resin.

The temperature is then preferably permitted to rise the first temperature to a second temperature, preferably between about 60° C. and 80° C., and more preferably 70 C. The time required for the temperature rise to occur depends on the scale on which the exothermic reaction is being carried out. On a production scale, this temperature rise can occur over a period of about thirty minutes. If desired, the reaction vessel can be cooled to slow the temperature increase.

This second temperature is preferably maintained until the free formaldehyde content of the aqueous mixture drops by about 65 percent of the initial free formaldehyde level and more preferably by about 60 percent of the initial free formaldehyde level, by weight.

Next, the aqueous mixture is preferably cooled, preferably to a temperature between about 20° C. and 30° C., and the aqueous mixture is acidified by addition of sulfamic acid, preferably to a pH of about 3 or less, more preferably to a pH of from about 2.5 to 3.5. Unexpectedly, such resins neutralized to a pH of about 3 or less exhibit actual solids that are greater than theoretical solids (based on unneutralized solids).

Typically, the process is selected to provide an aqueous resole resin with total solids of about 40 to 50 percent by weight. The aqueous resole resin can also include small amounts of residual formaldehyde, such as up to about 15 percent by weight, and small amounts of residual phenol, such as up to about 2 percent by weight. In addition, the aqueous resole resin will typically contain small amounts of residual sodium, calcium or like salts from the resin polymerization.

Because the acidified resole resin of the present process is stable at low pH, the acidified resole resin can be modified by subsequent addition of one or more acidic modifiers to alter or improve the properties, such as the cure characteristics, of the resulting resin and/or the binder subsequently prepared from the resole resin. The amount of acidic modifier employed depends upon the nature of the modifier and the extent of modification desired. Examples of suitable acidic modifiers that can be employed include latent catalysts such as aryl phosphites, salts of a primary or secondary amine and a strong acid, partial phosphate esters; reactive diluents such as benzylic alcohols; weak acids such as boric acid, and fatty acids such as oleic and stearic acids; and polycarboxylic acids such as polyacrylic acids. Aryl phosphite latent catalysts are disclosed, for example, by U.S. Pat. No. 5,317,050, as alternatives to strong acid catalysts for rapid hardening of phenolic resins at relatively modest elevated temperatures. Amine salts of strong acids are disclosed as effective latent catalysts for phenolic resins by U.S. Pat. No. 5,243,015, which also discloses the synergistic combination of such a latent catalyst with a minor amount of conventional strong acid cure catalyst. U.S. Pat. No. 5,378, 793 discloses partial phosphate esters as latent catalysts for phenolic resole resins, the partial phosphate esters being prepared by reaction of condensed phosphoric acids with polyols under controlled conditions. U.S. Pat. No. 6,133,403 discloses benzylic alcohols, namely alkoxy benzyl alcohols and dibenzyl ethers, as reactive diluents for phenolic resins hardenable with strong acid cure catalysts. The use of polyacrylic acids as an acidic modifier for resole resins is disclosed, for example, in U.S. Pat. Nos. 5,670,585 (reduction of ammonia emissions), 6,194,512 (preferential formation of trimethylol phenol) and U.S. Pat. No. 5,804, 254 (flexibilizing additive).

After preparation of the aqueous resole resin has been completed, the aqueous resin can be packaged, as by drumming, and stored until needed or transferred to a transportation vehicle such as a tank wagon or rail car and shipped to another site where binder for mineral fiber articles is to be produced.

The aqueous resole resin of the present invention has good stability, as measured by its water dilutability. Preferably, the aqueous resole resin can be diluted by greater than 2000 to 1 even after two weeks storage at low temperature (5° C. or 40° F.).

The aqueous resole resin produced can be used to prepare an aqueous binder for articles formed using mineral fibers. Typically, in such articles, the mineral fibers, such as glass fibers, are initially formed into a non-woven mat. An aqueous binder including the resole resin is typically sprayed on newly formed, still hot, glass fibers in a forming chamber or like apparatus to yield a wool-like mass including the glass fibers, bound by the resin binder. The characteristics and utility of the article produced are determined to some extent by the type of mineral fiber used, the length and diameter of the fibers, the density, oxidation, and concentration of the fibers in the mat, and the like. For some applications, it may be desirable to weave the fibers or otherwise form a fabric from the fibers.

Alternatively, in one embodiment of the present invention, the aqueous resole resin can be modified at the resin-manufacturing site by post-reaction with one or more formaldehyde scavengers for reducing the free formaldehyde before the resin is packaged and shipped. Alternatively, formaldehyde scavengers can be added later, after the resole resin arrives at the site where it will be used. Typically, the resole resin is diluted with water, and a cure catalyst is added, to form an aqueous binder. The binder is applied to the fibrous material to be bound; and the resole is cured by application of heat. The binder may also contain other components, such as one or more formaldehyde scavengers.

Typically, a nitrogenous reactant such as urea is employed as a formaldehyde scavenger for phenol-formaldehyde resole resins. Other scavengers can also be used, including nitrogenous reactants such as ammonia, ammonium hydroxide, primary and secondary amines, thiourea, dicyandiamide, guanidine, aminotriazoles such as guanamine and benzoguanamine, melamine, melamine-formaldehyde resins and dicyandimine-formaldehyde resins. Other type of formaldehyde scavengers can also be employed, such as sodium sulfite, sodium cyanide, and resorcinol. Combinations of reactants can also be used, with the combination of urea and ammonia being presently preferred.

Preferably, formaldehyde scavenger is added in an amount sufficient to react with substantially all residual formaldehyde in the resole resin. When urea employed as the formaldehyde scavenger, the mole ratio of urea to the free formaldehyde in the aqueous mixture including the resole resin is preferably from about 1:1 to 1.75:1. On mixing the formaldehyde scavenger with the aqueous resole resin, an increase in the pH of the aqueous mixture is observed, such as an increase in pH to a range of 7 to 9.

In one embodiment of the present process, urea and ammonia are added directly to the aqueous resole mixture, after the aqueous mixture has been acidified, and preferably no more than about three days after the acidification of the reaction mixture. Advantageously, the urea and ammonia can be added just after the acidification. Preferably, the aqueous reaction mixture thus provided is agitated for at least a time sufficient to ensure complete mixing of the resole resin, the urea, and the ammonia, such as for at least about 30 to 60 minutes, using conventional liquid mixing equipment. If the acidified aqueous mixture including the resole is stored for a period before the nitrogenous reactants are added, it is preferred that the aqueous mixture be stored at a temperature below ambient, such as from about 40 to 55° F.

The phenolic resin prepared by process of the present invention has a storage stability of at least about two weeks at temperatures up to at least about 55° F.

The process of the present invention can further include subsequently completing preparation of the binder by adding a catalyst, such as a latent acid catalyst, for curing the resole resin.

Examples of catalysts for curing the resole resin include acid catalysts such as salts, preferably ammonium or amino salts of acids, such as ammonium sulfate, ammonium phosphate, ammonium sulfamate, ammonium carbonate, ammonium acetate, ammonium maleate, and the like. The acid catalyst can be added in an amount of from about 0.1 to 5 percent by weight based on the weight of the resole resin, or on the basis of the resole resin and urea in the case of a urea-modified resole resin. When a latent catalyst is employed as an acidic modifier of the resin, the amount of cure catalyst can be reduced, or the cure catalyst can be omitted entirely, depending on the type and amount of latent catalyst employed.

Completing preparation of the binder can also include addition of a lubricant composition, such as a mineral oil emulsion, and a material promoting adhesion of the modified resole resin to the glass fibers, such as a suitable silane. An example of an adhesion-improving silane that can be added is 3-aminopropyl triethoxysilane. Other additives such as finely divided mineral fibers, non-reactive organic resins such as Vinsol (trademark of Hercules) resin (derived from rosin), tall oil, surface active compounds such as lignosulfonate salts, thickeners and rheology control agents, dyes, color additives, water, and the like, can also be added to the aqueous binder.

Prior to application of the binder, the binder can be diluted by addition of water to provide a concentration suitable for application to the hot mineral fibers or mineral fiber web or mat. For example, water can be added to provide a total solids content of from about 1 to 80 percent by weight.

The aqueous binder can be applied directly to newly formed, still hot glass fibers, or to a mineral fiber mat or fabric, and subsequently dried and cured to form an article. The mineral fiber can be a glass fiber, and the mat can be a non-woven mat. The mineral fibers can be continuous or chopped or can take the form of a mineral fiber wool. When glass fiber is used, it can be formed by any conventional process, such as by flame or steam blowing, by centrifugal fiberizing, or the like. The shape, fiber, density, fiber lengths, fiber orientation, and like characteristics of the fiber mat depend on the application intended for the articles produced.

One especially important application is thermal insulation. In this case, the fiber mats take the form of continuous rolls or batts of non-woven, randomly oriented glass fibers. A similar mat is used in the production of glass fiber batts for acoustic insulation.

When thermal and acoustic glass fiber insulation is to be produced, the newly formed, still hot glass fibers are typically sprayed in a forming chamber or hood with the aqueous binder to distribute a coating of binder over the fibers, and especially at contact points between fibers. If the hot fibers do not have sufficient heat content to drive off the water, the mat coated with the aqueous binder solution can be subsequently thermally dried to remove water. In either case, the resinous compounds including the resole and the nitrogenous reactant are cured to form an infusible binder for the mineral fiber mat.

The process of the present invention can also be used to prepare binders for other mineral fiber articles such as battery separators, printed circuit boards, and electrical insulation products as well as for processed wood products such as chipboard, particle board, plywood, and the like.

The following examples are illustrative of the processes, compositions, and articles of the present invention, and will be useful to those of ordinary skill in the art in practicing the invention. However, the invention is in no way limited by these examples. Unless otherwise indicated all percentages are given on a weight basis in the following examples.

EXAMPLE 1

100 parts of commercial grade phenol and 255 parts of a 50% (w/w) aqueous solution of formaldehyde are introduced into a reactor. The reactor is heated and the contents are agitated until the temperature of the mixture stabilizes at 45° C. The temperature is maintained at a first temperature of 45° C and 10 parts of 50% sodium hydroxide (w/w) is added at a steady rate over a thirty-minute period. The temperature is then permitted to rise to a second temperature of 70° C., within thirty minutes, and this second temperature is maintained for 60 minutes. The reaction mixture is cooled. The pH of the resin is adjusted by addition of 3.1 parts of solid sulfamic acid (based on the total liquid weight) to give a pH of 3. (Example 1). The solids of the resin were measured and were found to be 48.74 percent by weight based on unneutralized solids, and the theoretical solids were calculated to be 45.25 percent, calculated on the same basis.

The process is repeated except that 2.8 parts of solid sulfamic acid are added to give a pH of 7 (Comparative Example 1). The solids of the resin were measured and were found to be 47.46 percent by weight based on unneutralized solids, and the theoretical solids were calculated to be 45.17 percent, calculated on the same basis.

Example 1 and Comparative Example 1 show that the acidification to a pH of 3 provides a higher actual solids (compared with theoretical) than neutralization to a pH of 7.

Various modifications can be made in the details of the various embodiments of the processes, compositions and articles of the present invention, all within the scope and spirit of the invention and defined by the appended claims.

What is claimed is:

1. A process for preparing a phenolic binder for glass fibers, the process comprising a) preparing a water-soluble phenol-formaldehyde resole resin by:

1) preparing an initial aqueous mixture including formaldehyde and phenol;

2) adding a basic polymerization catalyst to the initial aqueous mixture;

3) maintaining the aqueous mixture at a predetermined temperature during reaction of the phenol and formaldehyde to form the water-soluble phenol-formaldehyde resole resin until the free formaldehyde content of the aqueous mixture drops to a predefined level;

4) cooling the aqueous mixture; and 5) acidifying the aqueous mixture with sulfamic acid to a pH of no greater than 3;

b) subsequently completing preparation of the binder by adding a catalyst for curing the modified resole resin.

2. A process according to claim 1 further comprising a) preparing an aqueous, reaction mixture including the phenol-formaldehyde resole resin and urea; and b) permitting the urea to react with the phenol-formaldehyde resole resin to form a modified resin.

3. A process according to claim 1 further comprising mixing an acidic modifier with the aqueous mixture.

4. A process according to claim 3 wherein the acidic modifier is a latent catalyst.

5. A process according to claim 3 wherein the acidic modifier is a reactive diluent.

6. A process according to claim 1 wherein the phenol-formaldehyde resin has a formaldehyde-to-phenol mole ratio of from about 25:1 to 4.2:1.

7. A process according to claim 6 wherein the phenol-formaldehyde resin has a formaldehyde-to-phenol ratio of from about 3.2:1 to 4.0:1.

8. A process according to claim 1 wherein the predefined level is about 40 percent by weight of the free formaldehyde in the initial aqueous mixture.

9. A process according to claim 2 further comprising adding ammonia to the reaction mixture wherein the ammonia is added in sufficient quantity to give a weight ratio of ammonia to solids of unmodified resin of from about 1.0:100 to 3.0:100.

10. A process according to claim 1 wherein the aqueous mixture including the unmodified resole resin is acidified to a pH from about 2 to 3.

11. A process according to claim 2 wherein the mole ratio of the urea to the free formaldehyde of the phenol-formaldehyde resin is from about 1:1 to 1.75:1.

12. A process according to claim 2 wherein the aqueous mixture is agitated for at least a time sufficient to ensure complete mixing.

13. A process according to claim 2 wherein the aqueous mixture is maintained at a temperature of from about 5° C. to 30° C. while permitting the urea to react with the resole resin.

14. A process according to claim 2 wherein completing preparation of the binder further includes adding a mineral oil lubricant and an organo-silane adhesion promoter to the aqueous mixture including the modified resole resin.

15. An improved binder for glass fibers prepared according to the process of claim 1.

16. A process for producing a glass fiber batt, the process comprising:

a) preparing a water-soluble phenol-formaldehyde resole resin by:

1) preparing an initial aqueous mixture including formaldehyde and phenol;

2) adding a basic polymerization catalyst to the initial aqueous mixture;

3) maintaining the aqueous mixture at a predetermined temperature during reaction of the phenol and formaldehyde to form the water-soluble phenol-formaldehyde resole resin until the free formaldehyde content of the aqueous mixture drops to a predefined level;

4) cooling the aqueous mixture; and 5) acidifying the aqueous mixture with sulfamic acid to a pH of no greater than 3;

b) preparing a binder for the glass fibers by subsequently adding a catalyst for curing the modified resole resin, c) spraying the binder on glass fibers to form a batt and d) curing the binder at an elevated temperature.

17. The process of claim 16 further comprising a) preparing an aqueous reaction mixture including the phenol-formaldehyde resole resin and urea; and b) permitting the urea to react with the phenol-formaldehyde resole resin to form a modified resin.

18. A process according to claim 17 further comprising adding ammonia to the reaction mixture.

19. A process according to claim 16 further comprising mixing an acidic additive with the aqueous mixture.

20. A product prepared by the process of claim 16.

* * * * *